(12) United States Patent
Iwasaki et al.

(10) Patent No.: US 8,228,059 B2
(45) Date of Patent: Jul. 24, 2012

(54) FERRITE MATERIAL HAVING COMPOSITION GRADIENT FOR MEASURING MAGNETO-OPTICAL-EFFECT PROPERTIES AND METHOD FOR EVALUATING PROPERTIES OF FERRITE

(75) Inventors: Yosuke Iwasaki, Chiba (JP); Masashi Kawasaki, Sendai (JP); Tomoteru Fukumura, Sendai (JP)

(73) Assignees: JFE Mineral Company, Ltd., Tokyo (JP); Tohoku University, Sendai-Shi, Miyagi (JP)

(*) Notice: Subject to any disclaimer, the term of this patent is extended or adjusted under 35 U.S.C. 154(b) by 0 days.

(21) Appl. No.: 13/203,460

(22) PCT Filed: Mar. 12, 2010

(86) PCT No.: PCT/JP2010/054722
§ 371 (c)(1),
(2), (4) Date: Aug. 25, 2011

(87) PCT Pub. No.: WO2010/107098
PCT Pub. Date: Sep. 23, 2010

(65) Prior Publication Data
US 2011/0305890 A1    Dec. 15, 2011

(30) Foreign Application Priority Data

Mar. 16, 2009 (JP) .................................. 2009-063054
Feb. 26, 2010 (JP) .................................. 2010-041529

(51) Int. Cl.
*G01R 33/02* (2006.01)
(52) U.S. Cl. .................................................. 324/244.1
(58) Field of Classification Search ................. 324/244.1
See application file for complete search history.

(56) References Cited

U.S. PATENT DOCUMENTS 3,441,429 A * 4/1969 Hacskaylo .................... 427/130
6,143,435 A * 11/2000 Il"Yashenko et al. ...... 428/822.2

FOREIGN PATENT DOCUMENTS

| JP | 4-202051 A | 7/1992 |
| JP | 2000-267057 A | 9/2000 |
| JP | 2002-310900 A | 10/2002 |

OTHER PUBLICATIONS

X.R. Zhao et al, High-throughput characterization of $Bi_xY_{3-x}Fe_5O_{12}$ combinatorial thin films by magneto-optical imaging technique, Applied Surface Science, Jan. 31, 2006, vol. 252, Issue 7, pp. 2628-2633.

* cited by examiner

*Primary Examiner* — Reena Aurora
(74) *Attorney, Agent, or Firm* — Holtz, Holtz, Goodman & Chick, PC

(57) ABSTRACT

Provided is a method of evaluating properties of ferrite which can continuously measure change in magnetic properties accompanying change in composition of the ferrite merely by preparing one specimen.
A composition gradient ferrite thin film constituted of a plurality of composition gradient ferrite layers which are formed by inclining component composition in the horizontal direction is formed on a single crystal substrate having light transmitting property using a thin film forming method, and a magneto-optical effect is continuously measured along the composition gradient direction of the ferrite thin film whereby change in magnetic properties accompanying a change in composition of the ferrite is continuously measured also provided is a method of evaluating properties of ferrite which can continuously measure change in magnetic properties accompanying change in composition of the ferrite merely by preparing one specimen.

6 Claims, 12 Drawing Sheets

[FIG.1]
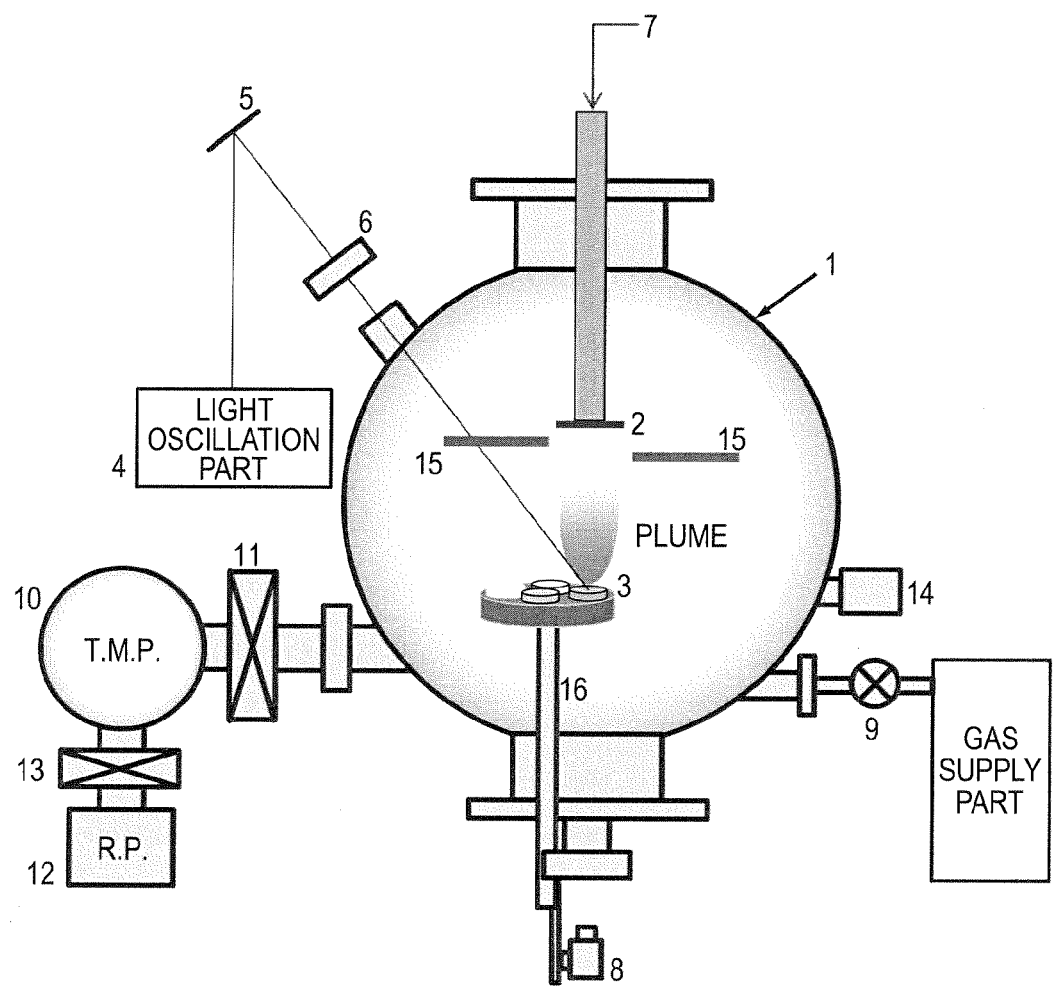

[FIG.2]
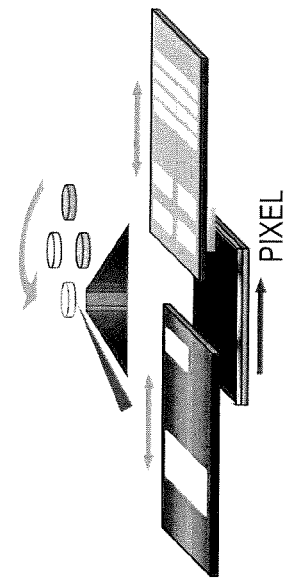
(a) SUPER LATTICE PARALLEL INTEGRATION
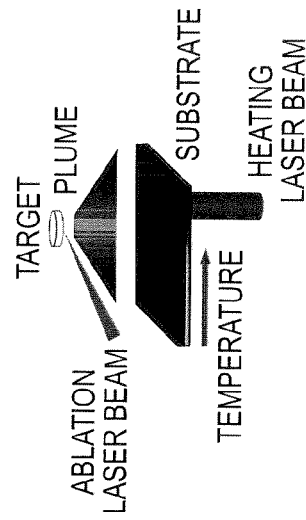
(b) COMPOSITION MODULATION INTEGRATION
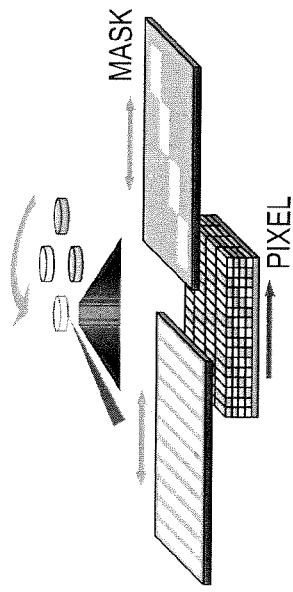
(c) COMPOSITION GRADIENT
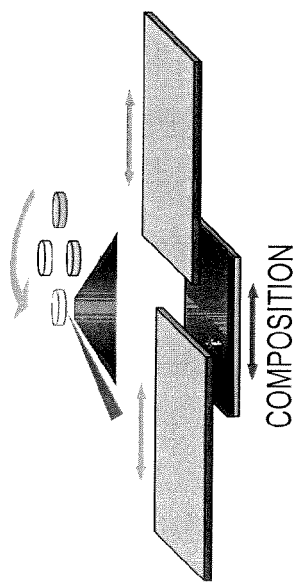
(d) SYNTHESIZING TEMPERATURE GRADIENT

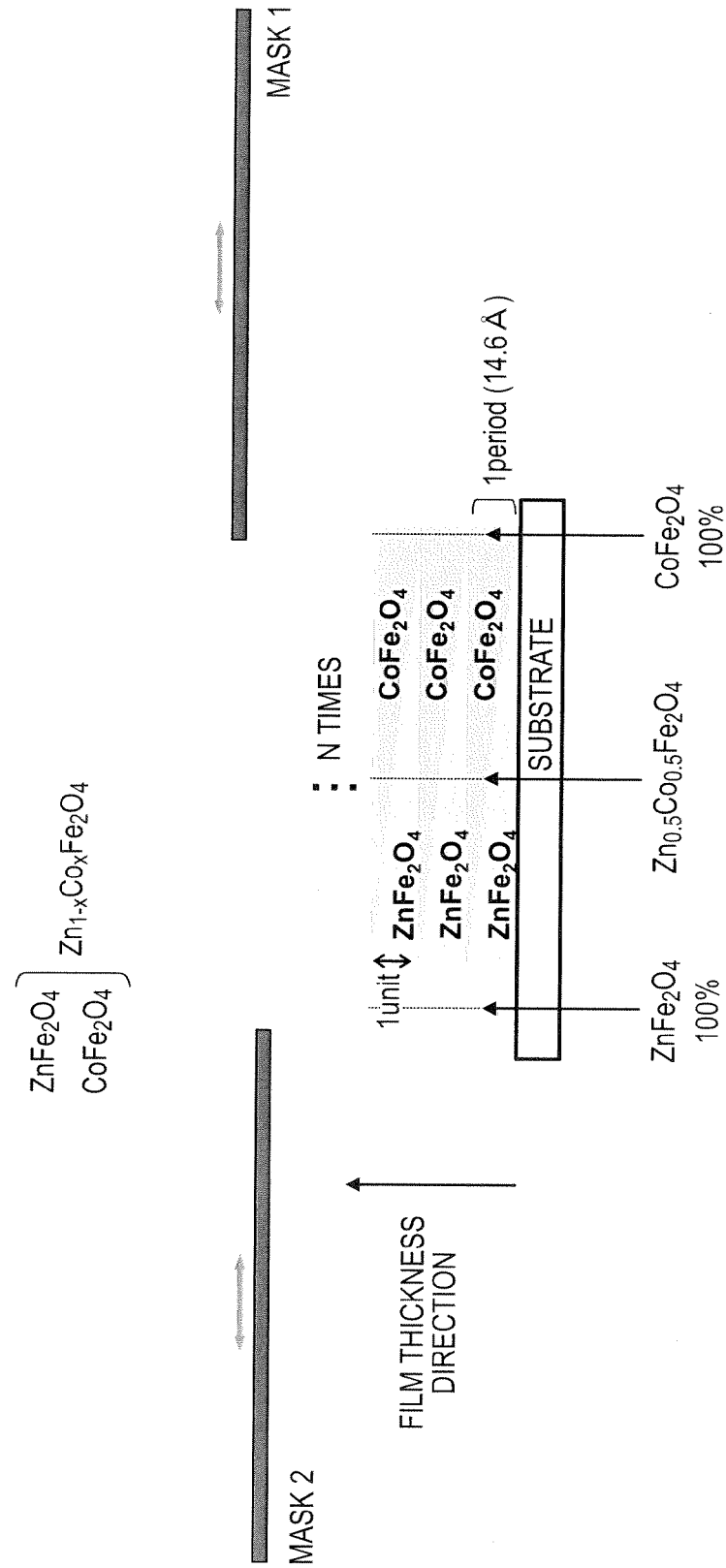

[FIG.4]
(a)
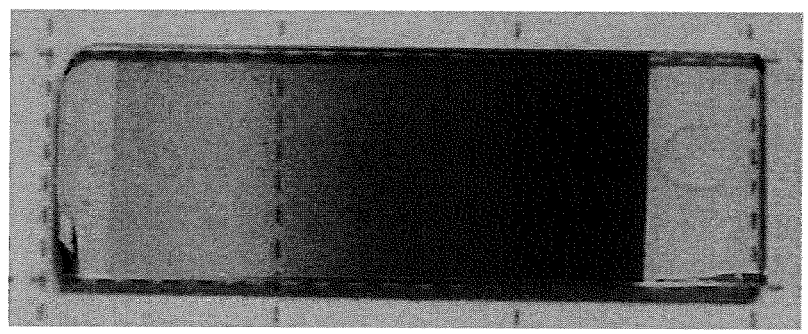
(b)
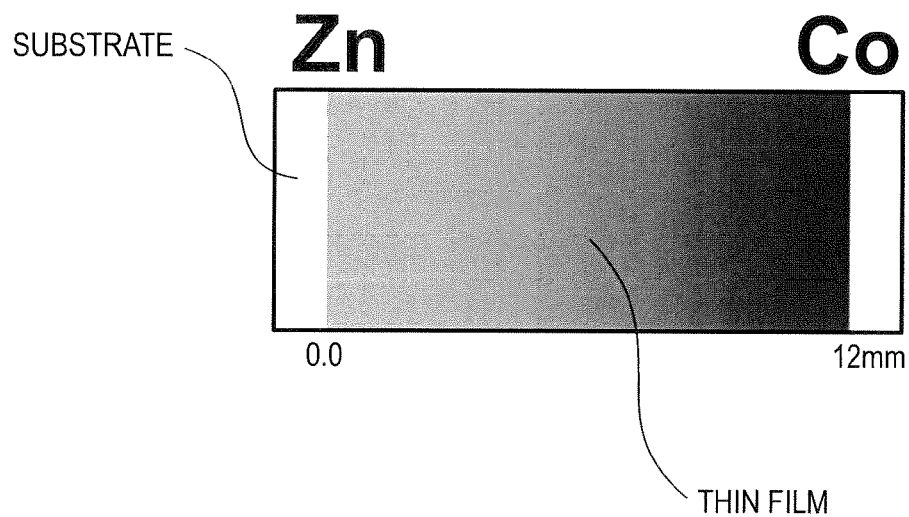

[FIG.5]
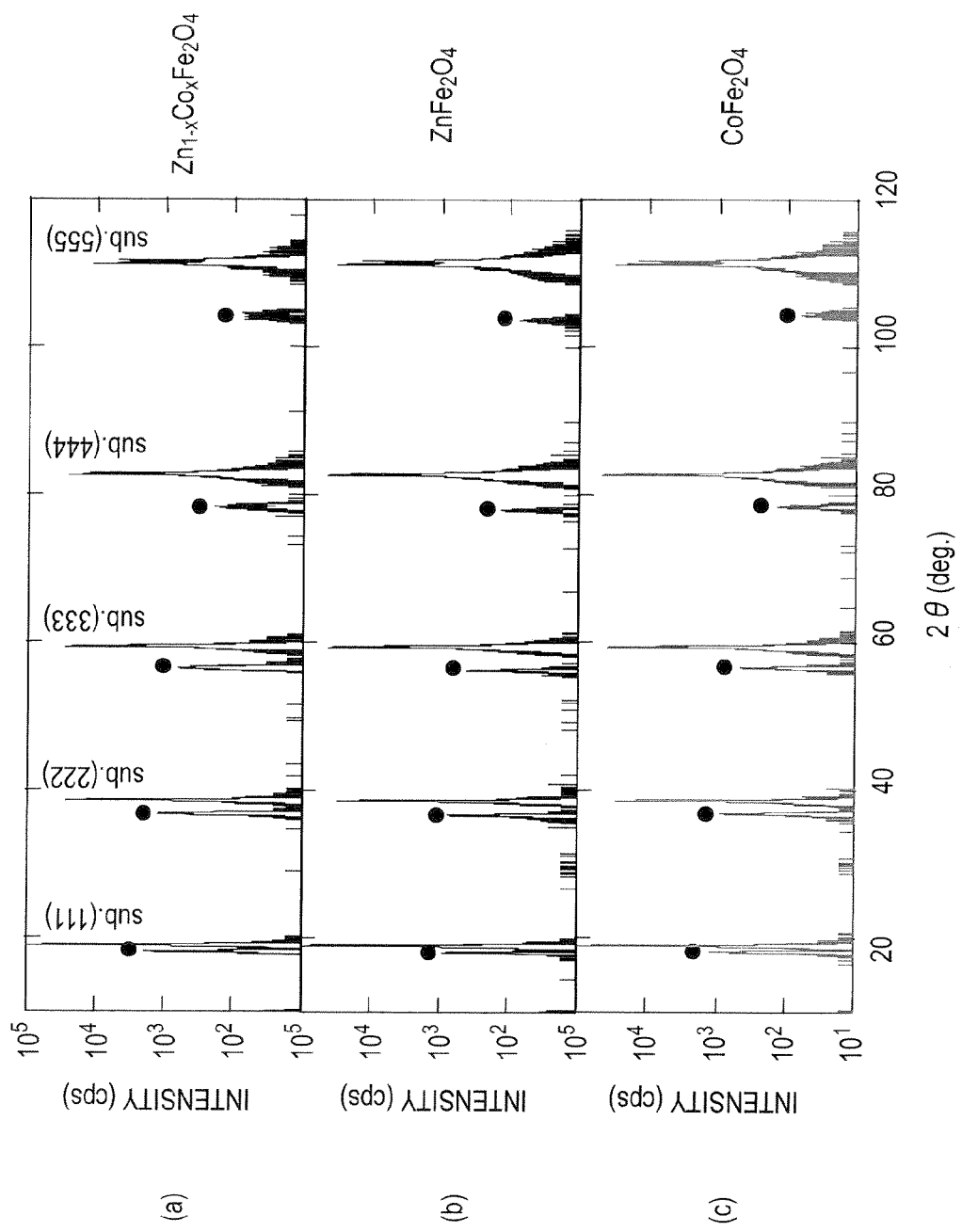

[FIG.6]
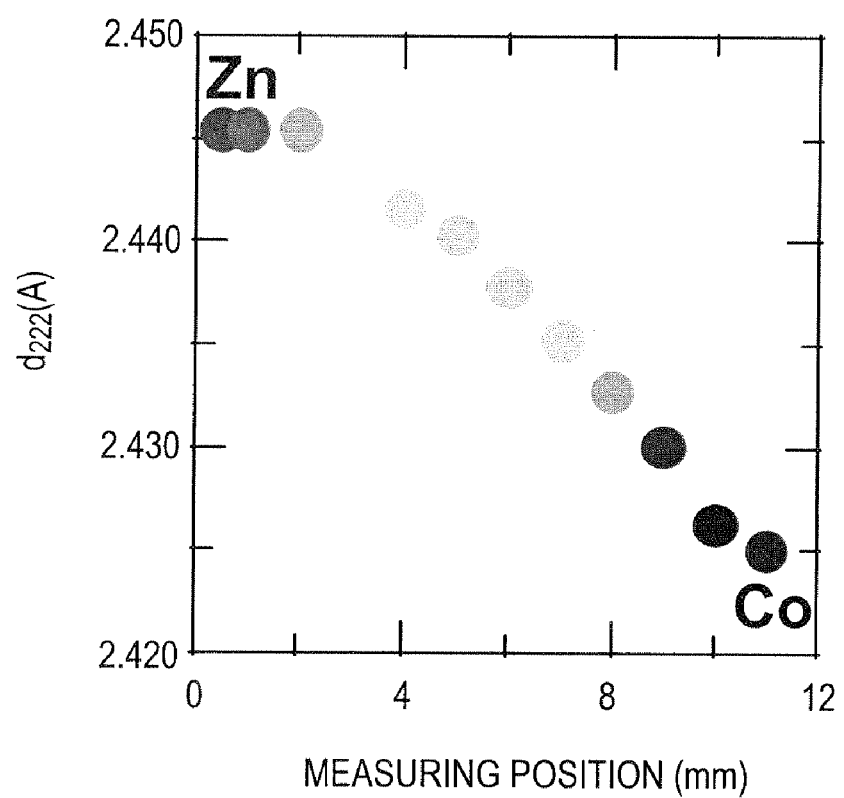

[FIG.7]
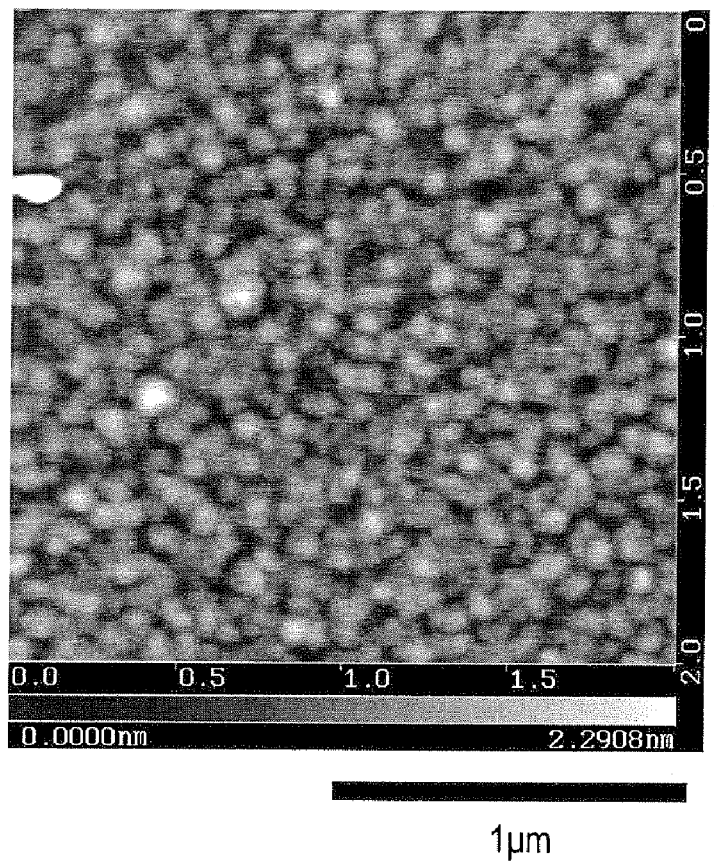

[FIG.8]
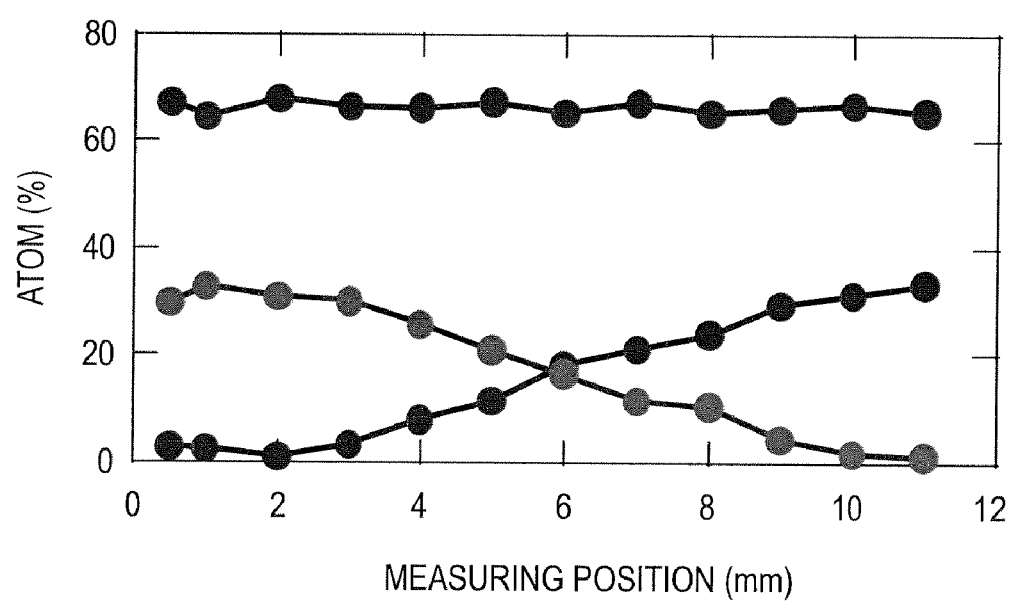

[FIG.9]
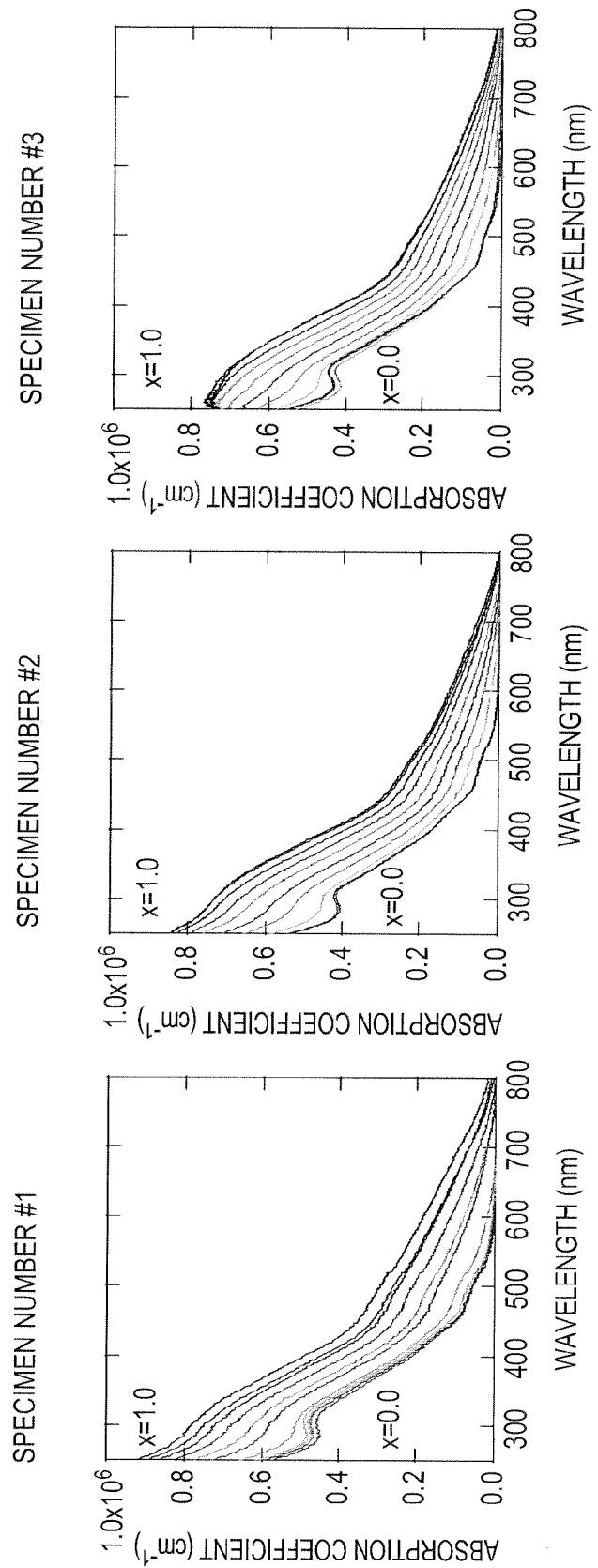

[FIG.10]
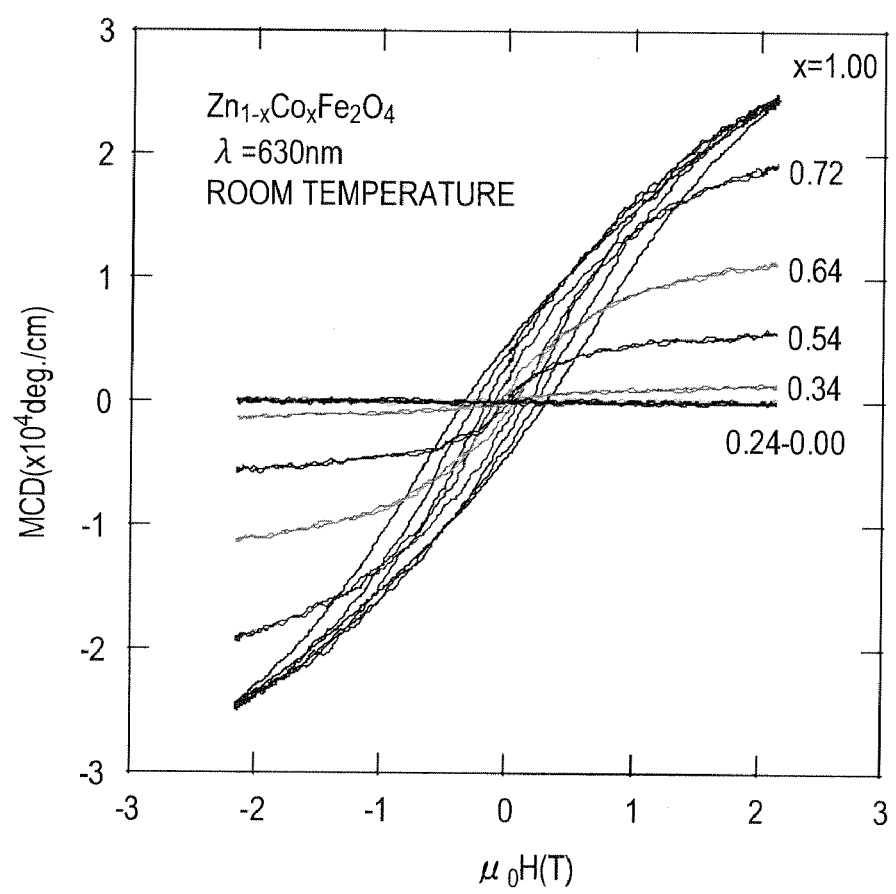

[FIG.11]
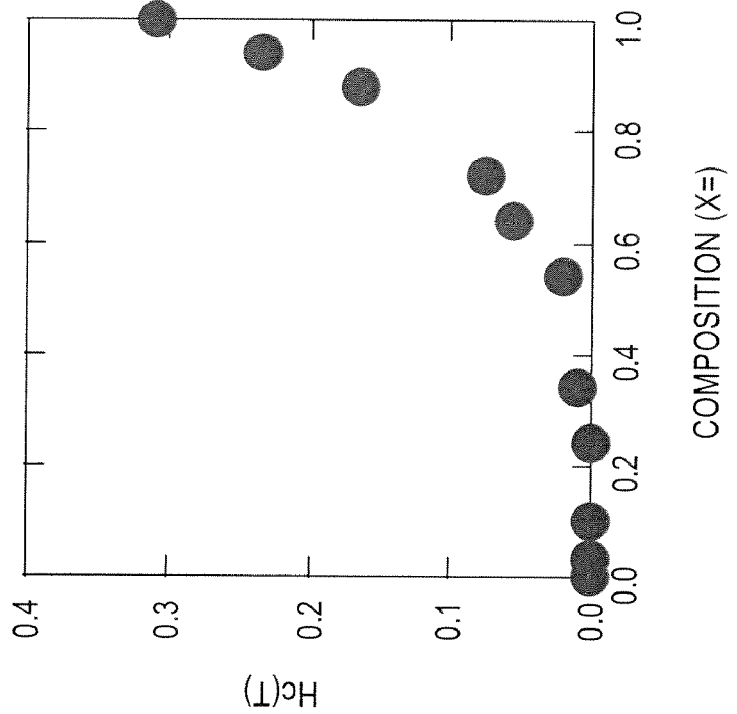
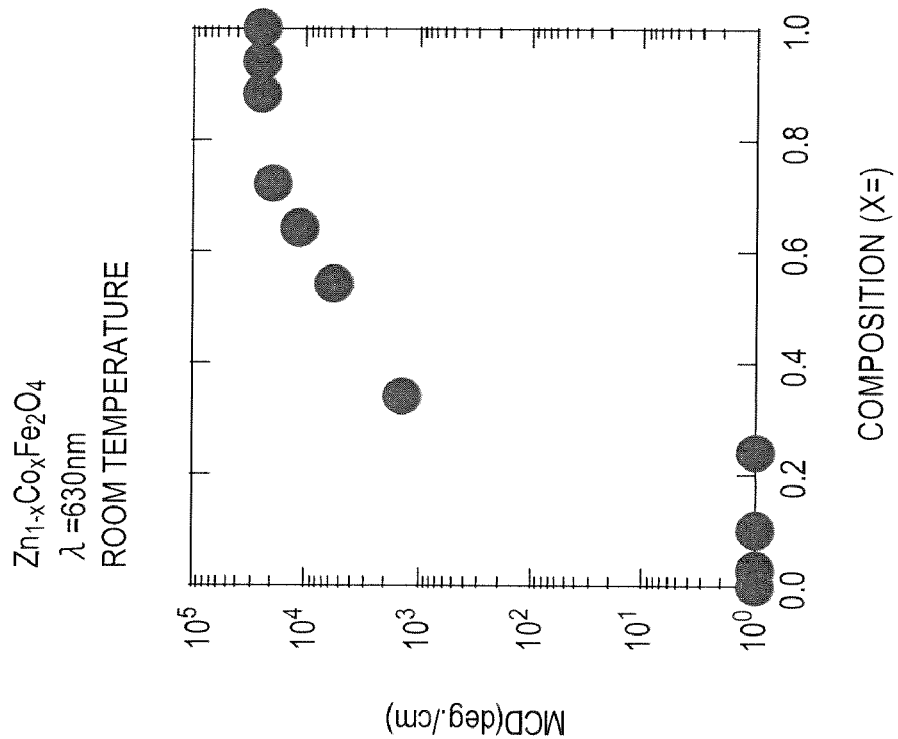

[FIG.12]
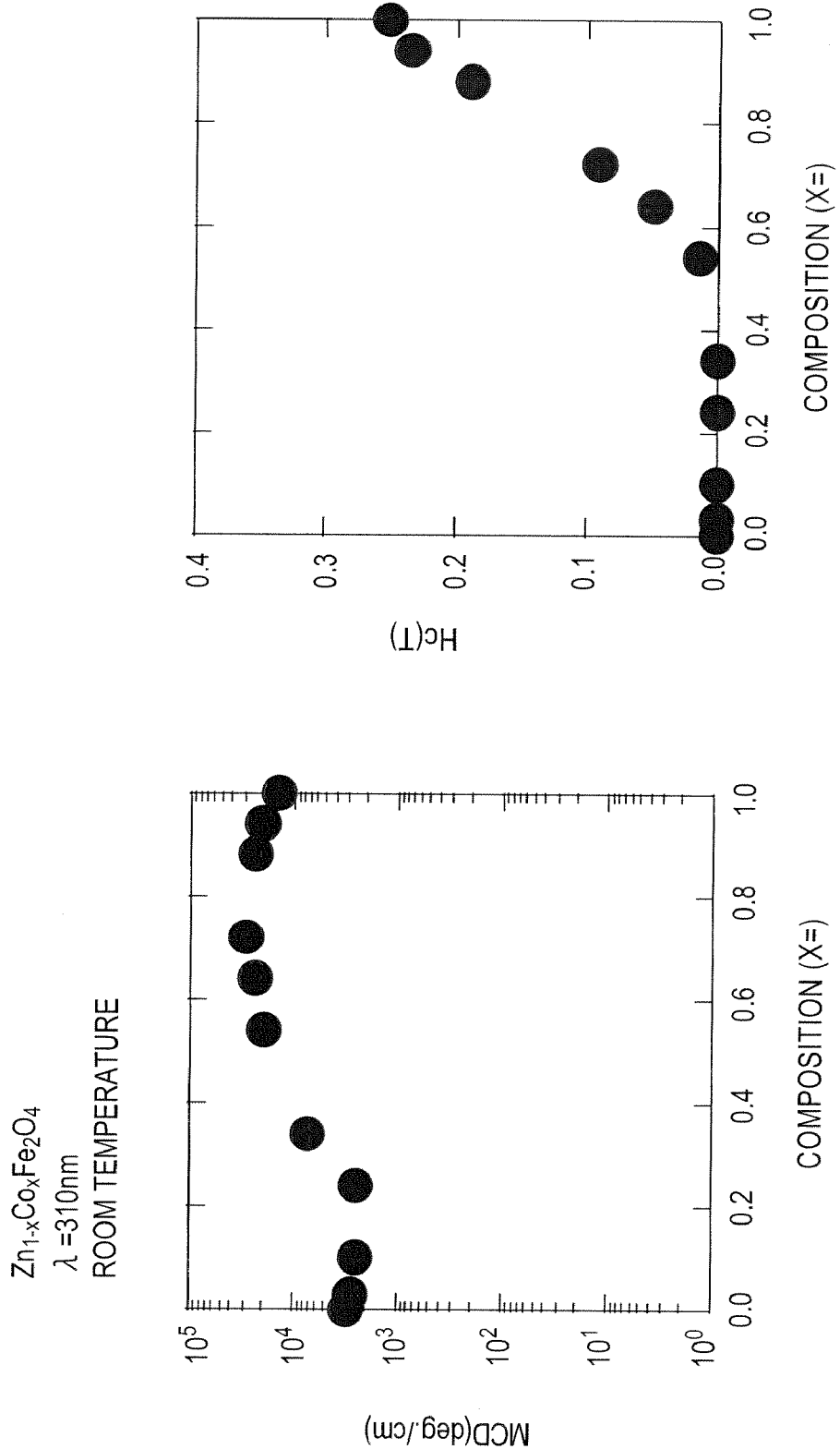

FERRITE MATERIAL HAVING COMPOSITION GRADIENT FOR MEASURING MAGNETO-OPTICAL-EFFECT PROPERTIES AND METHOD FOR EVALUATING PROPERTIES OF FERRITE

TECHNICAL FIELD

This application is the United States national phase application of International Application PCT/JP2010/054722 filed Mar. 12, 2010.

The present invention relates to a ferrite material having a composition gradient for measuring magneto-optical-effect properties.

The invention also relates to a method for evaluating properties of ferrite using the above-mentioned ferrite material having a composition gradient for measuring magneto-optical-effect properties, and particularly to a technique for rapidly and simply determining changes in magnetic properties when the component composition of ferrite is changed by making use of a magneto-optical-effect.

BACKGROUND ART

As a magnetic material, ferrite has been broadly used in various fields described below.

Ferrite has been popularly used in various applications. For example, ferrite has been used as hard ferrite in a miniaturized motor-use magnetic pole which makes use of a rotor-use magnet, a measuring device, an electric device such as a microphone or a speaker, a magnet roller, a magnetic separator, a machine mechanism such as a magnetic bearing, a magnet in health promoting equipment, a magnet incorporated in a stationery, a magnet incorporated in a toy and the like. Ferrite has been also used as soft ferrite in a magnetic core, a magnetic head or a magnetic shield for power transmission, communication, deflection of beams in a CRT or the like which makes use of soft magnetism; a microwave device which makes use of a microwave property such as a filter, an isolator, a circulator, an antenna or an electromagnetic wave absorber; an optical communication/optical device which makes use of a magneto-optical property such as an optical isolator, an optical circulator, a photo switch or a magnetic field sensor; a microwave communication device which makes use of a microwave property such as a filter, a resonator or a circulator; and a magnetic memory device such as a magnetic bubble memory.

In the above-mentioned respective applications, properties which ferrite is required to satisfy vary largely and hence, it is necessary to provide ferrite which has properties conforming to each application.

Magnetic properties of ferrite mainly depend on component composition of ferrite and hence, to provide ferrite having desired properties, it is necessary to adjust the composition of ferrite to the component composition which conforms to required properties.

Conventionally, to grasp a change in magnetic properties accompanying a change in composition of ferrite, a large number of ferrite specimens which are made slightly different from each other in component composition of ferrite are prepared, and the magnetic properties of the respective specimens are measured one by one (non-patent document 1, for example).

However, the preparation of even one specimen requires a large number of steps from the preparation of raw materials to the manufacture of a sintered body. Further, it is necessary to prepare a large number of such specimens in which the component composition is made slightly different from each other for every composition and hence, not only it takes a long time to prepare the specimens, but also a cost is pushed up. The related art also has a drawback that the accuracy of measurement is lowered due to disturbances described below during the preparation of specimens.

When samples are prepared and evaluated one by one, the biggest concern is whether or not the preparation and the evaluation can be carried out in the same environment. For example, when a series of experiments is carried out over several days, the possibility that the preparation and the evaluation of the samples are influenced by the weather such as the temperature and the humidity is increased. Further, as to other concerns, whether or not the Supply of electricity to a device is stable, whether or not the device interferes with a peripheral device and the like are named.

In this respect, if a large number of samples can be prepared and evaluated at the same time, the above-mentioned possibility could be remarkably lowered.

PRIOR ART LITERATURE

Non-Patent Document

[Non-patent Document] Lecture on Experimental Physics 6, Magnetic Measurement I, Maruzen Company Ltd

SUMMARY OF THE INVENTION

Problems that the Invention is to Solve

The invention has been made in view of the above-mentioned circumstances, and it is an object of the invention to provide, in detecting a magnetic property when a component which becomes a target (hereinafter referred to as a target component) is changed in ferrite having a specific component system, a ferrite material having a composition gradient for measuring magneto-optical-effect properties which allows the continuous measurement of change in magnetic properties accompanying a change in composition of the target component merely by preparing one specimen.

It is another object of the invention to provide a method of evaluating properties of ferrite which can, with the use of the above-mentioned ferrite material having a composition gradient, rapidly and simply determine a change in magnetic properties when the component composition of ferrite is changed by making use of a magneto-optical effect.

Means for Solving the Problem

Inventors of the invention have made extensive studies to overcome the above-mentioned drawbacks, and have made a finding that the above-mentioned objects can be advantageously achieved by combining a gradient thin film manufacturing technique which has been developed recently and a magneto-optical effect.

The invention has been made based on such a finding.

That is, the constitution which forms the gist of the invention is as follows.

1. A composition gradient ferrite material for measuring magnetic properties which is provided with a composition gradient ferrite thin film formed by inclining component composition in the horizontal direction on a single crystal substrate having a light transmitting property, wherein the composition gradient ferrite thin film is formed of a multilayer film of composition gradient ferrite layers formed by inclining the component composition in the horizontal direction of the single crystal substrate, and a thickness of each composition gradient ferrite layer is 0.8 to 4.5 nm and a total thickness of the multilayer film is 30 to 10000 nm.

2. The composition gradient ferrite material according to the above 1, wherein the ferrite is any one of spinel ferrite, Y-type hexagonal crystal ferrite and garnet ferrite which are expressed by the following general formulae respectively.

Spinel Ferrite ti General formula: $A_{1-x}B_x Fe_2O_4 (0.00 \leq x \leq 1.00)$ wherein, A and B respectively are one, or two or more kinds of elements which are selected from a group consisting of Sc, Ti, V, Cr, Mn, Fe, Co, Ni, Cu, Zn, Mg, Al, Ga and In (A≠B).

Y-type hexagonal crystal ferrite

General formula: $A_2(B1_xB2_y)Fe_{12}O_{22} (0.00 \leq x \leq 2.00, 0.00 \leq y \leq 2.00, x+y=2.00)$ wherein, A is Ba and/or Sr, B1, B2 respectively are one, or two or more kinds of elements which are selected from a group consisting of Sc, Ti, V, Cr, Mn, Fe, Co, Ni, Cu, Zn, Mg, Al, Ga and In (B1≠B2).

Garnet Ferrite

General formula: $(Bi_xR_{3-x})(Fe_{5-y}M_y)O_{12}$ $(0.00 \leq x \leq 1.60, 0.00 \leq y \leq 1.00)$ wherein R is one, or two or more kinds of elements which are selected from a group consisting of Sc, Y and a rare earth element, and M is Ga and/or Al.

3. The composition gradient ferrite material according to the above 1 or 2, wherein the single crystal substrate is an $MgAl_2O_4$ (111) substrate or an $Al_2O_3$(0006) substrate.

4. The composition gradient ferrite material according to any one of the above 1 to 3, wherein the light transmitting property of the single crystal substrate, assuming a thickness of the substrate as 0.5 mm, satisfies 70% or more of transmissivity of light having a wavelength of 250 to 2500 nm.

5. A Method of Evaluating Properties of Ferrite comprising the steps of:

forming a composition gradient ferrite thin film constituted of a plurality of composition gradient ferrite layers which are formed by inclining component composition in the horizontal direction on a single crystal substrate having a light transmitting property using a thin film forming method; and measuring a magneto-optical effect continuously along the composition gradient direction of the ferrite thin film whereby change in magnetic properties accompanying a change in composition of the ferrite is continuously measured.

6. The method of evaluating properties of ferrite according to the above 5, wherein the ferrite is any one of spinel ferrite, Y-type hexagonal crystal ferrite and garnet ferrite which are expressed by the following general formulae respectively.

Spinel Ferrite

General formula: $A_{1-x}B_xFe_2O_4 (0.00 \leq x \leq 1.00)$ wherein, A and B respectively are one, or two or more kinds of elements which are selected from a group consisting of Sc, Ti, V, Cr, Mn, Fe, Co, Ni, Cu, Zn, Mg, Al, Ga and In (A≠B).

Y-Type Hexagonal Crystal Ferrite

General formula: $A_2(B1_xB2_y)Fe_{12}O_{22} (0.00 \leq x \leq 2.00, 0.00 \leq y \leq 2.00, x+y=2.00)$ wherein, A is Ba and/or Sr, B1, B2 respectively are one, or two or more kinds of elements which are selected from a group consisting of Sc, Ti, V, Cr, Mn, Fe, Co, Ni, Cu, Zn, Mg, Al, Ga and In (B1≠B2).

Garnet Ferrite

General formula: $(Bi_xR_{3-x})(Fe_{5-y}M_y)O_{12}$ $(0.00 \leq x \leq 1.60, 0.00 \leq y \leq 1.00)$ wherein R is one, or two or more kinds of elements which are selected from a group consisting of Sc, Y and rare earth elements, and M is Ga and/or Al.

7. The method of evaluating properties of ferrite according to the above 5 or 6, wherein the single crystal substrate is an $M_gAl_2O_4$ (111) substrate or an $Al_2O_3$(0006) substrate.

8. The method of evaluating properties of ferrite according to any one of the above 5 to 7, wherein the thin film forming method is any one of a laser ablation method (PLD method), an ALD method, a CVD method, a vapor deposition method and a sputtering method.

Advantage of the Invention

According to the invention, change in magnetic properties accompanying change in component composition of ferrite can be rapidly, simply and accurately determined.

Further, it is known that a magnitude of a magneto-optical effect such as a magneto-optical Faraday effect or a magnetic circular dichroism is proportional to a magnitude of magnetization. Accordingly, by preparing a composition gradient thin film having many components and determining dependency of magneto-optical effect properties of the composition gradient thin film on the composition in accordance with the invention, it is possible to select the optimum composition corresponding to a magnetic field or a wavelength at the time the product is used.

Accordingly, the preparation of a large number of samples and the measurement of material property data can be rapidly performed and hence, the swift application of the composition gradient ferrite material and the method of evaluating properties of ferrite according to the invention to a material design and parts and devices can be expected as a result.

BRIEF DESCRIPTION OF THE DRAWINGS

FIG. 1 is a schematic view of an apparatus for forming a thin film suitable for carrying out a PLD method.

FIG. 2 is a schematic view showing the manner of operation for integrating a large number of specimen groups which is performed using a combinatorial technique.

FIG. 3 is a schematic view showing the manner of operation for forming a $Zn_{1-x}Co_xFe_2O_4$ composition gradient thin film which is formed of a multilayer film by applying a combinatorial technique to a PLD method.

FIG. 4(a) is a photograph of a $Zn_{1-x}Co_xFe_2O_4$ composition gradient thin film which is prepared using a PLD method, and FIG. 4(b) is a view showing a composition gradient state more clearly based on the photograph shown in FIG. 4(a).

FIG. 5(a) is a graph showing an X-ray diffraction pattern on the whole surface of the $Zn_{1-x}Co_xFe_2O_4$ film, and FIG. 5(b) and FIG. 5(c) are graphs showing an X-ray diffraction pattern on a $ZnFe_2O_4$ film and an X-ray diffraction pattern on a $CoFe_2O_4$ film.

FIG. 6 is a graph showing a $d_{222}$ value at respective measuring positions of the $Zn_{1-x}Co_xFe_2O_4$ film.

FIG. 7 is a photograph of a surface AFM image showing a surface unevenness of the $Zn_{1-x}CO_xFe_2O_4$ film at an atomic level.

FIG. 8 is a graph showing the composition of Zn, Co and Fe at respective measuring positions on the $Zn_{1-x}Co_xFe_2O_4$ film.

FIG. 9 is a graph showing the relationship between a wavelength and an absorption coefficient with respect to three kinds of $Zn_{1-x}Co_xFe_2O_4$ film which differ from each other in film thickness.

FIG. 10 is a graph showing a result of measurement of dependency of a magneto-optical effect (magnetic circular dichroism) of respective compositions of a $Zn_{1-x}Co_xFe_2O_4$ film on a magnetic field at a room temperature using light having a wavelength of 630 nm.

FIG. 11 is a graph showing change in magnetic circular dichroism (MCD) and a coercive force (Hc) at a wavelength of 630 nm with respect to change in composition.

FIG. 12 is a graph showing change in magnetic circular dichroism (MCD) and a coercive force (Hc) at a wavelength of 310 nm with respect to change in composition.

MODE FOR CARRYING OUT THE INVENTION

The invention is explained specifically hereinafter.

No particular limitation is imposed on ferrite which is an object to be evaluated in the invention, and all kinds of conventionally known ferrites such as spinel ferrite, Y-type hexagonal crystal ferrite and garnet ferrite can be used as ferrite in the invention.

Spinel ferrite is ferrite which is expressed by the following general formula.

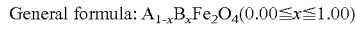
General formula: $A_{1-x}B_xFe_2O_4 (0.00 \leq x \leq 1.00)$ wherein, A and B respectively are one, or two or more kinds of elements which are selected from a group consisting of Sc, Ti, V, Cr, Mn, Fe, Co, Ni, Cu, Zn, Mg, Al, Ga and In (A≠B).

Y-type hexagonal crystal ferrite is ferrite which is expressed by the following general formula.

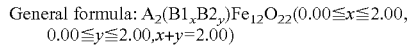
General formula: $A_2(B1_xB2_y)Fe_{12}O_{22}$ ($0.00 \leq x \leq 2.00$, $0.00 \leq y \leq 2.00, x+y=2.00$)

wherein, A is Ba and/or Sr, B1, B2 respectively are one, or two or more kinds of elements which are selected from a group consisting of Sc, Ti, V, Cr, Mn, Fe, Co, Ni, Cu, Zn, Mg, Al, Ga and In (B1≠B2)

Garnet ferrite is ferrite which is expressed by the following general formula.

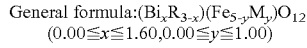
General formula: $(Bi_xR_{3-x})(Fe_{5-y}M_y)O_{12}$
$(0.00 \leq x \leq 1.60, 0.00 \leq y \leq 1.00)$ wherein R is one, or two or more kinds of elements selected from a group consisting of Sc, Y and rare earth elements, and M is Ga and/or Al.

Further, a kind of single crystal substrate of the invention is not necessarily limited provided that the single crystal substrate has a light transmitting property. Here, "has a light transmitting property" means that assuming a thickness of the substrate as 0.5 mm, transmissivity of light having a wavelength of 250 to 2500 nm is 70% or more. Further, the reason that a range of wavelength of light used for evaluating transmissivity is set to 250 to 2500 nm is that the desired favorable transmissivity which the invention aims at cannot be obtained when the wavelength of light is outside this wavelength range.

On the other hand, as the single crystal substrate, a single crystal substrate having a lattice constant which approximates a lattice constant of a ferrite thin film formed on the single crystal substrate is advantageous. Further, the use of a single crystal substrate in which an oriented surface of a formed film is liable to be directed to an axis of easy magnetization is more advantageous. For example, when an object to be evaluated is spinel ferrite or Y-type hexagonal crystal ferrite, as the single crystal substrate, an $MgAl_2O_4(111)$ substrate or an $Al_2O_3(0006)$ substrate can be advantageously used.

As the thin film forming method, all of conventionally known thin film forming techniques such as a laser ablation (PLD: Pulse Laser Deposition) method, an ALD (Atomic Laser Deposition) method, a CVD (Chemical Vapor Deposition) method, a vapor deposition method (a room temperature vapor deposition method, a high temperature vapor deposition method, a thermal vapor deposition method, an electron beam vapor deposition method and the like) and a sputtering method can be used. Among these methods, the PLD method can be particularly advantageously used because of various advantages described below.

(1) Even when a target is an oxide material having a high melting point, the target can be instantaneously formed into plasma by a pulse laser beam and hence, a thin film having the same composition ratio as the target can be easily prepared.

(2) A growth speed can be controlled based on a temperature of a substrate, a gas pressure, laser beam energy density and the like, and a film thickness can be easily changed by changing the number of pulses.

(3) A thin film material formed into plasma possesses energy supplied from a laser and hence, a thin film can be formed in a state where oxygen gas is introduced into a chamber at a pressure ranging from an ultra high vacuum to an atmospheric pressure.

A case where a ferrite thin film according to the invention is formed using the PLD method is explained hereinafter.

The PLD method is a method in which a pulse laser beam is intermittently irradiated to a target (thin film raw material: sintered body or single crystal), and ions, clusters, molecules, atoms or the like which are discharged from the target due to the ablation of the target (a plasma-like state where these dissociation species are collected being referred to as "plume") are deposited on a substrate which is arranged to face the target in an opposed manner thus forming a thin film on the substrate.

FIG. 1 schematically shows a thin film forming device which is favorably used in carrying out the PLD method.

As shown in the drawing, the thin film forming device is configured such that a substrate 2 and a target 3 are arranged in a chamber 1 in a state where the substrate 2 and the target 3 face each other in an opposed manner. Outside the chamber 1, a reflection mirror 5 for adjusting a position of a pulse laser beam oscillated by a light oscillation part 4 and a lens 6 for controlling a spot diameter of the laser beam are arranged. Numeral 7 indicates a semiconductor laser for heating the substrate. The temperature of the substrate 2 is monitored by a radiation thermometer 8 which is arranged outside the chamber through a window and is controlled so as to always assume a predetermined temperature. An adjustment valve 9 for adjusting a flow rate of an oxygen gas is attached to the chamber 1. To realize the formation of a film under a reduced pressure, a turbo molecular pump 10 and a pressure valve 11 are connected to the chamber. The pressure in the chamber is controlled to assume $1.33 \times 10^{-5}$ to $1.33 \times 10^{-1}$ Pa ($1 \times 10^{-7}$ to $1 \times 10^{-2}$ Torr) in an oxygen atmosphere, for example, using the oxygen gas flow rate adjustment valve 9 and the pressure valve 11. Further, a hydraulic rotary pump 12 and a reverse flow preventing valve are connected to the turbo molecular pump 10, and an exhaust-side pressure of the turbo molecular pump 10 is always held at $1.33 \times 10^{-1}$ Pa ($1 \times 10^{-3}$ Torr) or less. Numeral 14 indicates a pressure monitor, numeral 15 indicates a mask, and numeral 16 indicates a rotary shaft.

As a pulse laser beam irradiated to the target, for example, a KrF excimer laser beam having a pulse frequency of to 10

Hz, a laser power of 1 J/cm² and a wavelength of approximately 248 nm can be preferably used.

By adopting a combinatorial technique in the above-mentioned PLD method, a thin film whose composition is continuously changed can be formed. Here, the combinatorial technique is a technique in which large kinds of compound groups (library) are efficiently synthesized and these compound groups are used depending on various purposes.

FIG. 2 schematically shows an example of the integration of 100 to 10000 pieces of specimen groups which differ in composition and super lattice structure. Here, the positional relationship between the substrate and the target is set opposite to the relationship between the substrate and the target shown in FIG. 1. FIG. 2(a) to FIG. 2(c) show a state where a mask on which a pattern is formed is inserted between a substrate and a target, and the mask is moved in synchronism with the selection of a plurality of targets. According to this method, kinds and quantities of elements supplied to the substrate can be accurately controlled in terms of time and space and hence, different kinds of substance can be synthesized parallel to each other on one sheet of substrate. Further, a synthesizing condition such as a substrate temperature can be set as shown in FIG. 2(d).

A technique shown in FIG. 2(c) is adopted by the invention.

Next, the explanation is made with respect to a specific case where a gradient thin film made of spinel ferrite having the $Zn_{1-x}Co_xFe_2O_4$ composition is formed using the above-mentioned technique.

(1) Target

As a target, a $CoFe_2O_4$ sintered body and a $ZnFe_2O_4$ sintered body are used. The $CoFe_2O_4$ sintered body can be prepared by mixing CoO powder and $Fe_2O_3$ powder which are weighed at a desired atomic ratio together and by applying SPS (Spark Plasma Sintering) to the powdery mixture. The $ZnFe_2O_4$ sintered body can be prepared by mixing ZnO powder and $Fe_2O_3$ powder which are weighed in a desired atomic ratio together and by applying SPS (Spark Plasma Sintering) to the powdery mixture. The target is arranged parallel to a thin film forming surface of the substrate.

(2) Substrate

An $MgAl_2O_4(111)$ substrate is used as the substrate in view of matching property between lattice constants, optical transmissivity in a broad wavelength range, and properties such as electric conductivity, non-magnetism, and thermal stability.

(3) Manufacturing Steps

Firstly, a polished substrate and a desired target are arranged in the inside of a chamber. Next, the condition in the chamber is set at an oxygen partial pressure of $1.33 \times 10^{-1}$ Pa ($1 \times 10^{-3}$ Torr) and a substrate temperature of 400° C. As shown in FIG. 3, a film is formed while changing a film thickness by moving masks 1, 2 parallel to a thin film forming surface of the substrate at a position close to the substrate. To be more specific, a pulse laser beam having energy density of 1 J/cm² and pulse irradiation of 5 Hz is intermittently irradiated while rotatably driving the target by way of a rotary shaft so that a temperature of a surface of the target is sharply elevated whereby ablation plasma (plume) is generated. Respective atoms of Zn, Co, Fe, O which are contained in the ablation plasma are moved to the substrate by gradually changing a state thereof repeating a collision and a reaction with an oxygen gas in the chamber. Then, particles containing Zn, Co, Fe, O atoms which reach the substrate are directly diffused on a (111) surface of the substrate and are formed into a thin film in a state where most stable lattice matching is acquired.

As a result, a composition gradient ferrite material formed of a multilayer film shown in FIG. 3 is obtained.

In the composition gradient ferrite material in accordance with the invention shown in FIG. 3, it is necessary to set the thickness of each layer of the multilayer film which forms the composition gradient ferrite thin film to 0.8 to 4.5 nm. This is because when the thickness of each layer does not reach 0.8 nm which is a size of unit cell of spinel, a magneto-optical spectrum cannot be obtained, while when the thickness of each layer exceeds 4.5 nm which is a unit cell of hexagonal crystal, the displacement in lattice constant with the substrate becomes large so that the clear magneto-optical spectrum cannot be also obtained. The preferred thickness of each layer is within a range of 1.0 to 2.0 nm. FIG. 3 shows an example where the thickness of each layer is 1.46 nm (14.6 angstrom).

Further, it is necessary to set the total thickness of the multilayer film from 30 to 10000 nm. This is because when the total thickness of the multilayer film does not reach 30 nm, the electron movement or transition which occurs on interfaces between the respective layers of the multilayer film is decreased so that the accurate measurement of a magneto-optical effect becomes difficult, while when the total thickness of the multilayer film exceeds 10000 nm, sufficient light transmitting property cannot be obtained at a measurement wavelength of 250 to 2500 nm. Preferred total thickness of the multilayer film is within a range of 40 to 200 nm. To take the efficiency of forming the thin film into consideration, it is advantageous that an upper limit of the total thickness of the multilayer film is set to approximately 100 nm.

By measuring the magneto-optical effect continuously along the composition gradient direction with respect to the composition gradient thin film obtained in the above-mentioned manner, it is possible to continuously measure change in magnetic properties accompanying change in composition of such ferrite.

That is, since a) the magnitude of the magnetic circular dichroism is proportional to the magnitude of magnetization of a thin film and b) a coercive force in the measurement of a magneto-optical effect is proportional to a coercive force of the thin film, by measuring the magneto-optical effect, it is possible to estimate the magnitude of the magnetization and the coercive force of the thin film based on these relationships a) and b).

Although the size of the ferrite composition gradient thin film in accordance with the invention is not necessarily limited, it is preferable to set a length of the ferrite composition gradient thin film to 1 to 152.4 mm and a width of the ferrite composition gradient thin film to 1 to 152.4 mm. When the length and the width of the ferrite composition gradient thin film are less than 1 mm, the handling of the thin film becomes difficult, while when the length and the width of the ferrite composition gradient thin film exceeds 152.4 mm, there arises a problem with the uniformity of the film composition.

EMBODIMENT

Embodiment 1

Using a thin film forming device shown in FIG. 1, a composition gradient thin film shown in FIG. 4(a) made of $Zn_{1-x}Co_xFe_2O_4$ ($0.00 \leq x \leq 1.00$) and having a length of 12 mm, a width of 5 mm and a thickness of 70 nm was formed on an $MgAl_2O_4(111)$ substrate (thickness: 0.5 nm) using a laser ablation method (PLD method) under conditions where a temperature of an $MgAl_2O_4(111)$ substrate was set to 400° C. and oxygen partial pressure was set to $1.33 \times 10^{-1}$ Pa ($1 \times 10^{-3}$ Torr). FIG. 4(a) is a photograph of the $Zn_{1-x}Co_xFe_2O_4$ composition gradient thin film which is prepared using a PLD method, and FIG. 4(b) is a view showing a composition gradient state more clearly based on the photograph shown in FIG. 4(a).

A target used for the formation of such a $Zn_{1-x}Co_xFe_2O_4$ film is a target which is prepared such that a quantity of CoO powder, a quantity of ZnO powder and a quantity of $Fe_2O_3$ powder are adjusted respectively such that these quantities agree with the stoichiometric composition of $CoFe_2O_4$ and the stoichiometric composition of $ZnFe_2O_4$, the adjusted powders are mixed together, and powder mixtures are subjected to discharge plasma sintering (SPS (Spark Plasma Sintering)). In this example, 50 composition gradient layers each having a thickness of 1.4 nm was multi-layered and the multilayer film had the total thickness of 70 nm.

Respective various physical properties of the $Zn_{1-x}Co_xFe_2O_4$ composition gradient thin film which is obtained in the above-mentioned manner are examined and the result of the examination is explained hereinafter.

FIG. 5(a) shows an X-ray diffraction pattern on a whole surface of the $Zn_{1-x}Co_xFe_2O_4$ film obtained in the above-mentioned manner, FIG. 5(b) shows an X-ray diffraction pattern on a $ZnFe_2O_4$ film obtained under the same condition as the $Zn_{1-x}Co_xFe_2O_4$ film, and FIG. 5(c) show an X-ray diffraction pattern on a $CoFe_2O_4$ film obtained under the same condition as the $Zn_{1-x}Co_xFe_2O_4$ film.

As can be clearly understood from these graphs, the $Zn_{1-x}Co_xFe_2O_4$ film has the multilayered structure where $ZnFe_2O_4$ and $CoFe_2O_4$ are mixed to each other.

FIG. 6 is a graph showing a $d_{222}$ value of the $Zn_{1-x}Co_xFe_2O_4$ film at respective measuring positions.

As shown in the graph, to focus on the direction of the composition gradient of the $Zn_{1-x}Co_xFe_2O_4$ film, it was confirmed that the $d_{222}$ value was increased along with the decrease of a value of x, and when the value of x was 0 (x=0), the $Zn_1CO_xFe_2O_4$ film exhibited the same $d_{222}$ value as the $ZnFe_2O_4$ film, while when the value of x was 1 (x=1), the $Zn_{1-x}Co_xFe_2O_4$ film exhibited the same $d_{222}$ value as the $CoFe_2O_4$ film.

FIG. 7 is a surface AFM image showing the surface unevenness on the $Zn_{1-x}CO_xFe_2O_4$ film at an atomic level.

As can be clearly understood from the image, an atom layer step appears at equal intervals on the surface of the $Zn_{1-x}Co_xFe_2O_4$ film so that a flat surface is formed at an atomic level.

FIG. 8 is a graph showing a composition ratio among Zn and Co and Fe of the $Zn_{1-x}Co_xFe_2O_4$ film at respective measuring positions. The composition ratio was measured using an energy dispersion type X-ray analyzer.

It is understood from the graph that a ratio between Zn and Co in the $Zn_{1-x}Co_xFe_2O_4$ film is changed approximately linearly in the composition gradient direction.

Further, by changing a preparation time of the $Zn_{1-x}Co_xFe_2O_4$ film, a thickness of the $Zn_{1-x}Co_xFe_2O_4$ film was changed so as to have various film thicknesses, that is, the film thickness of 16 nm (specimen number: #1), thickness of 35 nm (specimen number: #2), and thickness of 70 nm (specimen number: #3).

FIG. 9 is a graph showing absorption coefficients at a room temperature of the above-mentioned three kinds of $Zn_1Co_xFe_2O_4$ films obtained based on a transmission spectrum and a reflection spectrum in relationship with a wavelength.

As shown in the graph, it is understood that the spectrum is shifted along with change in the composition of the $Zn_{1-x}Co_xFe_2O_4$ film.

However, the film thickness of the specimen number #1 was 16 nm so that the film thickness did not satisfy the lower limit of the invention and hence, the specimen number #1 could not obtain a clear magneto-optical spectrum. On the other hand, the specimen number #2 and the specimen number #3 whose film thicknesses satisfied a proper range of a film thickness set according to the invention could obtain a clear magneto-optical spectrum.

FIG. 10 is a graph showing a result of measurement of dependency of a magneto-optical effect (magnetic circular dichroism) of respective compositions of a $Zn_{1-x}Co_xFe_2O_4$ film on a magnetic field at a room temperature using light having a wavelength of 630 nm.

As shown in the graph, it is understood that the magnetic circular dichroism is changed along with change in the composition of the $Zn_{1-x}Co_xFe_2O_4$ film.

FIG. 11 is a graph showing change in magnetic circular dichroism (MCD) and a coercive force (Hc) at a wavelength of 630 nm with respect to change in composition which are read from FIG. 10.

FIG. 12 is, in the same manner as FIG. 11, a graph showing a result of investigation on change in magnetic circular dichroism (MCD) and a coercive force (Hc) at a wavelength of 310 nm with respect to change in composition.

To compare FIG. 11 and FIG. 12 with each other, attentions should be paid to plots of the MCD.

That is, in the measurement of the MCD at the wavelength $\lambda$ of 630 nm, the MCD takes the largest value when x is 1.0 ($CoFe_2O_4$), while in the measurement of the MCD at the wavelength $\lambda$ of 310 nm, the MCD takes the largest value when x is 0.72 ($Zn_{0.28}Co_{0.72}Fe_2O_4$). This result means that it is preferable to use $Zn_{1-x}Co_xFe_2O_4$ doped with approximately 30% of Zn in case of the application which uses a wavelength of 310 nm, for example.

Further, it is also understood that, in the composition where x<0.24, the MCD value is substantially zero at the wavelength $\lambda$ of 630 nm, while the MCD value is 2500 (deg./cm) or more at the wavelength $\lambda$ of 310 nm.

No explicit difference was found in the comparison of wavelength dependency with respect to a coercive force this time.

Embodiment 2

On an $MgAl_2O_4$ (111) substrate, composition gradient ferrite thin films having the $A_{1-x}B_xFe_2O_4$ ($0.00 \leq x \leq 1.00$) composition were formed by combining spinel ferrites which differed in an A site element and a B site element of the $ABFe_2O_4$ composition shown in Table 1 in various combinations as shown in Table 2. The ferrite thin films are formed substantially in accordance with the method adopted in the example 1. A thickness of each layer of a ferrite multilayer film and the total thickness of the ferrite multilayer film were changed to various values.

Magneto-optical effects of the respective composition gradient ferrite materials obtained in this manner were continuously measured along the composition gradient direction of the ferrite thin film. In this measurement, clarity of magneto-optical spectrum, the possibility of measurement of the magneto-optical effects and transmission property of light having a wavelength of 250 to 2500 nm were investigated. The obtained result is also shown in Table 2. "Good" was given when the clear magneto-optical spectrum was obtained and the magneto-optical effect could be properly measured, while "Bad" was given when the clear magneto-optical spectrum was not obtained and the magneto-optical effect could not be properly measured. Particularly, in the case I-1 ($Zn_{1-x}Co_xFe_2O_4$, film thickness of each layer: 1.4 nm, total thickness of ferrite thin film: 70 nm), the measurement of the magneto-optical effect could be performed most favorably and hence, "Very good" was given to the relative evaluation in the case I-1.

TABLE 1

| Symbol | A site element | B side element | Chemical formula |
|--------|----------------|----------------|------------------|
| I | Zn | Fe | $ZnFe_2O_4$ |
| II | Cu | Fe | $CuFe_2O_4$ |
| III | Mg | Fe | $MgFe_2O_4$ |
| 1 | Co | Fe | $CoFe_2O_4$ |
| 2 | Mn | Fe | $MnFe_2O_4$ |
| 3 | Fe | Fe | $Fe_3O_4$ |
| 4 | Ni | Fe | $NiFe_2O_4$ |

TABLE 2

| Combination | Gradient composition | thickness of multilayer film Each layer thickness (nm) | thickness of multilayer film Total thickness (nm) | Clarity of magneto-optical spectrum | Possibility of measurement of magneto-optical effect | Transmissivity of light having wavelength of 250 to 2500 nm (maximum value) (%) | Remarks |
|---|---|---|---|---|---|---|---|
| I-1 | $Zn_{1-x}Co_xFe_2O_4$ | 1.4 | 70 | Good | Very good | 80 | the invention |
|  |  | 0.8 | 72 | Good | Good | 80 | the invention |
|  |  | 4.0 | 72 | Good | Good | 80 | the invention |
|  |  | 1.4 | 35 | Good | Good | 83 | the invention |
|  |  | 1.4 | 200.2 | Good | Good | 68 | the invention |
|  |  | 0.5 | 70 | Bad | Bad | 80 | control |
|  |  | 5.0 | 70 | Bad | Bad | 80 | control |
|  |  | 1.4 | 21 | Good | Bad | 84 | control |
|  |  | 1.4 | 14980 | Good | Bad | 0 | control |
| I-2 | $Zn_{1-x}Mn_xFe_2O_4$ | 1.4 | 70 | Good | Good | 80 | the invention |
| I-3 | $Zn_{1-x}Fe_xFe_2O_4$ | 1.4 | 70 | Good | Good | 80 | the invention |
| I-4 | $Zn_{1-x}Ni_xFe_2O_4$ | 1.4 | 70 | Good | Good | 80 | the invention |
| II-1 | $Cu_{1-x}Co_xFe_2O_4$ | 1.4 | 70 | Good | Good | 80 | the invention |
| II-2 | $Cu_{1-x}Mn_xFe_2O_4$ | 1.4 | 70 | Good | Good | 80 | the invention |
| II-3 | $Cu_{1-x}Fe_xFe_2O_4$ | 1.4 | 70 | Good | Good | 80 | the invention |
| II-4 | $Cu_{1-x}Ni_xFe_2O_4$ | 1.4 | 70 | Good | Good | 80 | the invention |
| III-1 | $Mg_{1-x}Co_xFe_2O_4$ | 1.4 | 70 | Good | Good | 80 | the invention |
| III-2 | $Mg_{1-x}Mn_xFe_2O_4$ | 1.4 | 70 | Good | Good | 80 | the invention |
| III-3 | $Mg_{1-x}Fe_xFe_2O_4$ | 1.4 | 70 | Good | Good | 80 | the invention |
| III-4 | $Mg_{1-x}Ni_xFe_2O_4$ | 1.4 | 70 | good | good | 80 | the invention |

As shown in Table 2, in all examples of the invention which satisfies the requirements of the invention, the clear magneto-optical spectrum was obtained, and the magneto-optical effect could be property measured. To the contrary, in the controls where the thickness of each layer of the ferrite multilayer film and the total thickness of the ferrite multilayer film do not satisfy the requirements of the present invention, the clear magneto-optical spectrum could not be obtained and the magneto-optical effect could not be properly measured as a result.

Embodiment 3

On an $MgAl_2O_4(111)$ substrate, a Y-type hexagonal crystal composition gradient ferrite thin film having the $A_2(Zn_{2-x}Co_x)Fe_{12}O_{22}$ ($0.00 \leq x \leq 2.00$) composition was formed substantially in accordance with the method adopted by the example 1. A thickness of each layer of the obtained Y-type hexagonal crystal composition gradient ferrite thin film is 4.5 nm, the number of layers is 16, and the total thickness of the Y-type hexagonal crystal composition gradient ferrite thin film is 72 nm. As a target, a $Ba_2Zn_2Fe_{12}O_{22}$ sintered body and a $Ba_2Co_2Fe_{12}O_{22}$ sintered body were prepared. The $Ba_2Zn_2Fe_{12}O_{22}$ sintered body and the $Ba_2Co_2Fe_{12}O_{22}$ sintered body were respectively prepared by mixing a predetermined quantity of $Fe_2O_3$ powder, a predetermined quantity of $BaCo_3$ powder and a predetermined quantity of ZnO powder together and by mixing a predetermined quantity of $Fe_2O_3$ powder, a predetermined quantity of $BaCO_3$ powder and a predetermined quantity of CoO powder together, and by sintering the powdery mixtures using an electric furnace. A substrate temperature was 800° C. and a partial oxygen pressure was $1.33 \times 10^{-1}$ Pa ($1 \times 10^{-3}$ Torr).

Magneto-optical effects of the Y-type hexagonal crystal composition gradient ferrite material obtained in this manner were continuously measured along the composition gradient direction of the ferrite thin film. In this measurement, clarity of magneto-optical spectrum and the possibility of measurement of the magneto-optical effects were investigated. The clear magneto-optical spectrum could be obtained so that the measurement of the magneto-optical effect could be carried out favorably as a result.

INDUSTRIAL APPLICABILITY

According to the invention, change in magnetic properties accompanying change in component composition of ferrite can be determined rapidly, easily and accurately. Accordingly, it is possible to select the optimum composition corresponding to a magnetic field or a wavelength by preparing a composition gradient thin film having many components and by determining the dependency of the magneto-optical effect property of the composition gradient thin film on composition in accordance with the invention.

Accordingly, the preparation of a large number of samples and the measurement of data on material properties can be rapidly performed and hence, the swift application of the composition gradient ferrite material to a material design and parts and devices can be expected as a result.

Description of Reference Numerals and Signs

| | |
|---|---|
| 1: | chamber |
| 2: | substrate |
| 3: | target |
| 4: | light oscillation part |
| 5: | reflection mirror |
| 6: | lens |
| 7: | semiconductor laser |
| 8: | radiation thermometer |
| 9: | adjustment valve |
| 10: | turbo molecular pump |
| 11: | pressure valve |
| 12: | hydraulic rotary pump |
| 13: | reverse flow preventing valve |
| 14: | pressure monitor |
| 15: | mask |
| 16: | rotary shaft |

The invention claimed is:

1. A ferrite material having a composition gradient for measuring magneto-optical effect properties comprising a composition gradient ferrite thin film which has a gradient in the horizontal direction on a single crystal substrate having a light transmitting property, wherein
the composition gradient ferrite thin film is formed of a multilayer film of composition gradient ferrite layers inclined in the horizontal direction of the single crystal substrate,
a thickness of each composition gradient ferrite layer is 0.8 to 4.5 nm, and a thickness of said multilayer film is 30 to 10000 nm,
the ferrite is spinel ferrite or Y-type hexagonal ferrite which are characterized by the following general formulae respectively,
spinel ferrite general formula: $A_{1-x}B_xFe_2O_4$ $(0.00 \leq x \leq 1.00)$
wherein, A and B are respectively one, two or more kinds of elements selected from the group consisting of Sc, Ti, V, Cr, Mn, Fe, Co, Ni, Cu, Zn, Mg, Al, Ga and In and A≠B;
Y-type hexagonal ferrite general formula: $A_2(B1_xB2_y)Fe_{12}O_{22}$ $(0.00 \leq x \leq 2.00, 0.00 \leq y \leq 2.00, x+y=2.00)$
wherein, A is Ba and/or Sr, and B1 and B2 are respectively one, two or more kinds of elements selected from the group consisting of Sc, Ti, V, Cr, Mn, Fe, Co, Ni, Cu, Zn, Mg, Al, Ga and In and B1≠B2; and
the single crystal substrate is a $MgAl_2O_4$ (111) substrate.

2. The ferrite material having a composition gradient according to claim 1, wherein the transmitting property of the single crystal substrate, for a thickness of the substrate of 0.5 mm, satisfies 70% or more in terms of transmissivity of light having a wavelength of 250 to 2500 nm.

3. A method of evaluating properties of ferrite wherein a composition gradient ferrite thin film constituted of a plurality of composition gradient ferrite layers which form a multilayer film, said composition gradient ferrite layers have a gradient in the horizontal direction which is formed on a single crystal substrate having light transmitting property by a thin film forming method, and a magento-optical effect is continuously measured along the composition gradient direction of the ferrite thin film thus continuously measuring a change in magnetic properties caused by a change in composition of the ferrite, wherein
a thickness of each composition gradient ferrite layer is 0.8 to 4.5 nm, and a thickness of said multilayer film is 30 to 10000 nm,
the ferrite is spinel ferrite or Y-type hexagonal ferrite which are characterized by the following general formulae respectively,
spinel ferrite general formula: $A_{1-x}B_xFe_2O_4$ $(0.00 \leq x \leq 1.00)$
wherein, A and B are respectively one, two or more kinds of elements selected from the group consisting of Sc, Ti, V, Cr, Mn, Fe, Co, Ni, Cu, Zn, Mg, Al, Ga and In and A≠B;
Y-type hexagonal ferrite general formula: $A_2(B1_xB2_y)Fe_{12}O_{22}$ $(0.00 \leq x \leq 2.00, 0.00 \leq y \leq 2.00, x+y=2.00)$
wherein, A is Ba and/or Sr, and B1 and B2 are respectively one, two or more kinds of elements selected from the group consisting of Sc, Ti, V, Cr, Mn, Fe, Co, Ni, Cu, Zn, Mg, Al, Ga and In and B1≠B2; and
the single crystal substrate is a $MgAl_2O_4$(111) substrate.

4. The method of evaluating properties of ferrite according to claim 3, wherein the thin film forming method is one of a laser ablation method (PLD method), an an ALD method, a CVD method, a vapor deposition method and a sputtering method.

5. The method of evaluating properties of ferrite according to claim 3, wherein said ferrite is said spinel ferrite.

6. The method of evaluating properties of ferrite according to claim 3, wherein said ferrite is said Y-type hexagonal ferrite.

* * * * *